United States Patent
Kleveland

(10) Patent No.: US 6,515,537 B2
(45) Date of Patent: Feb. 4, 2003

(54) INTEGRATED CIRCUIT CURRENT SOURCE WITH SWITCHED CAPACITOR FEEDBACK

(75) Inventor: Bendik Kleveland, Los Altos, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/809,884

(22) Filed: Mar. 16, 2001

(65) Prior Publication Data

US 2002/0130706 A1 Sep. 19, 2002

(51) Int. Cl.[7] .............................. G05F 1/10; G05F 3/02
(52) U.S. Cl. ....................................... 327/538; 327/541
(58) Field of Search ................................ 327/538, 540, 327/541, 543, 158

(56) References Cited

U.S. PATENT DOCUMENTS

| 4,680,535 A | 7/1987 | Talmor ........................ 323/312 |
| 4,830,976 A | 5/1989 | Morris et al. .................. 437/47 |
| 5,694,032 A | 12/1997 | Gersbach et al. ............ 323/315 |
| 5,694,033 A | 12/1997 | Wei et al. .................... 323/315 |
| 5,841,703 A | 11/1998 | Wojciechowski ....... 365/189.09 |
| 6,194,954 B1 * | 2/2001 | Kim et al. ................... 327/535 |

* cited by examiner

*Primary Examiner*—Terry D. Cunningham
*Assistant Examiner*—Quan Tra
(74) *Attorney, Agent, or Firm*—Brinks Hofer Gilson & Lione

(57) ABSTRACT

An integrated circuit current source includes an oscillator, a capacitor, a capacitor charging circuit and a capacitor discharging circuit, all formed on an integrated circuit substrate. The capacitor, capacitor charging circuit, and capacitor discharging circuit form a switched capacitor circuit having a resistance that varies inversely with the frequency of oscillation of the oscillator. This switched capacitor circuit is included in a bias signal generator that generates a bias signal at a level that varies in accordance with frequency of the oscillating signal. This bias signal is used to control frequency of the oscillator to provide a stable frequency of oscillation and a stable output current.

10 Claims, 4 Drawing Sheets

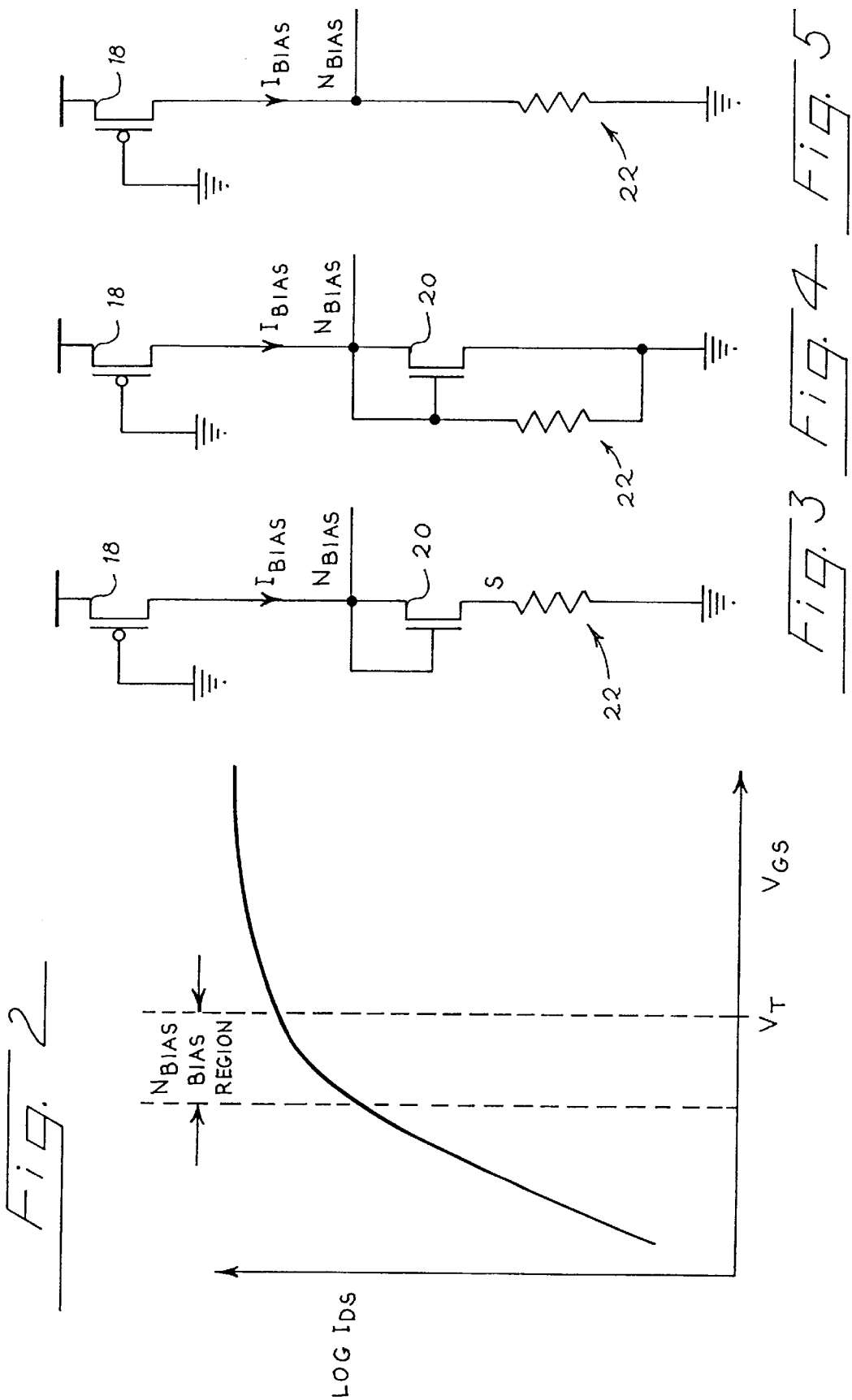

INTEGRATED CIRCUIT CURRENT SOURCE WITH SWITCHED CAPACITOR FEEDBACK

BACKGROUND

The present invention relates to a stable current source that can be implemented as an integrated circuit without off-chip frequency or resistive references, and without precision on-chip resistors.

Stable integrated circuit current sources of the prior art often use a reference resistor. This reference resistor can be an external precision resistor or alternatively an internal, on-chip resistor. External resistors require an additional pin for the off-chip reference resistor, while on-chip resistors generally vary significantly due to process variations. To achieve a stable on-chip resistor, the resistor can be trimmed at the expense of testing and trimming costs. U.S. Pat. No. 4,680,535 discloses a stable current source that uses a reference precision external resistor, and U.S. Pat. No. 4,830,976 discloses an on-chip resistor that is held within desired tolerances by precision doping.

FIG. 7 illustrates another prior-art current source that uses a precision resistor R. The current through the resistor R is equal to $I_{bias}=(V_{DD}-V_T)/R$. This current can be used to control other parameters. As an example, in FIG. 7 the resulting bias signal $N_{bias}$ is mirrored to $P_{bias}$. These bias signals are applied to a voltage controlled oscillator, which in this example is a five-stage ring oscillator fabricated from FET's. Because the resistor R provides a known resistance, the voltage controlled oscillator provides a stable operating frequency. The signals $N_{bias}$ and $P_{bias}$ can also be mirrored to generate stable output currents referenced to $V_{DD}$ or to ground, as shown in FIG. 7.

U.S. Pat. No. 5,694,032 discloses a fourth approach, in which an accurate frequency source controls the switching rate of a switched capacitor network.

U.S. Pat. No. 5,694,033 relates to a fifth approach, in which diodes and FET's are used to generate a current reference.

In spite of this earlier work, a need presently exists for an improved current source that provides a stable output current without external resistors, precision on-chip resistors, or precision frequency sources.

SUMMARY

The preferred embodiment illustrated in FIG. 1 operates as a stable current source without requiring an external resistor, an internal precision resistor, or a precision frequency source. This circuit uses a switched capacitor circuit that includes the gate capacitor of a transistor. This gate capacitor is one of the best controlled layers in a CMOS process. Furthermore, the resistance of the switched capacitor circuit is inversely proportional to capacitance, making it possible to achieve a very large resistance value in a small area.

In the embodiment of FIG. 1, the bias current $I_{bias}$ controls the frequency of oscillation of a voltage controlled oscillator, and the oscillating output signal generated by this oscillator controls the switching rate of the switched capacitor circuit.

The foregoing paragraphs have been provided by way of general introduction, and they should not be used to narrow the scope of the following claims.

BRIEF DESCRIPTION OF THE DRAWINGS

FIG. 2 is a current versus voltage graph illustrating operation of the circuit of FIG. 1.

FIGS. 3, 4 and 5 are schematic diagrams of alternative bias generating circuits.

DETAILED DESCRIPTION OF THE PRESENTLY PREFERRED EMBODIMENTS

Figure 1:
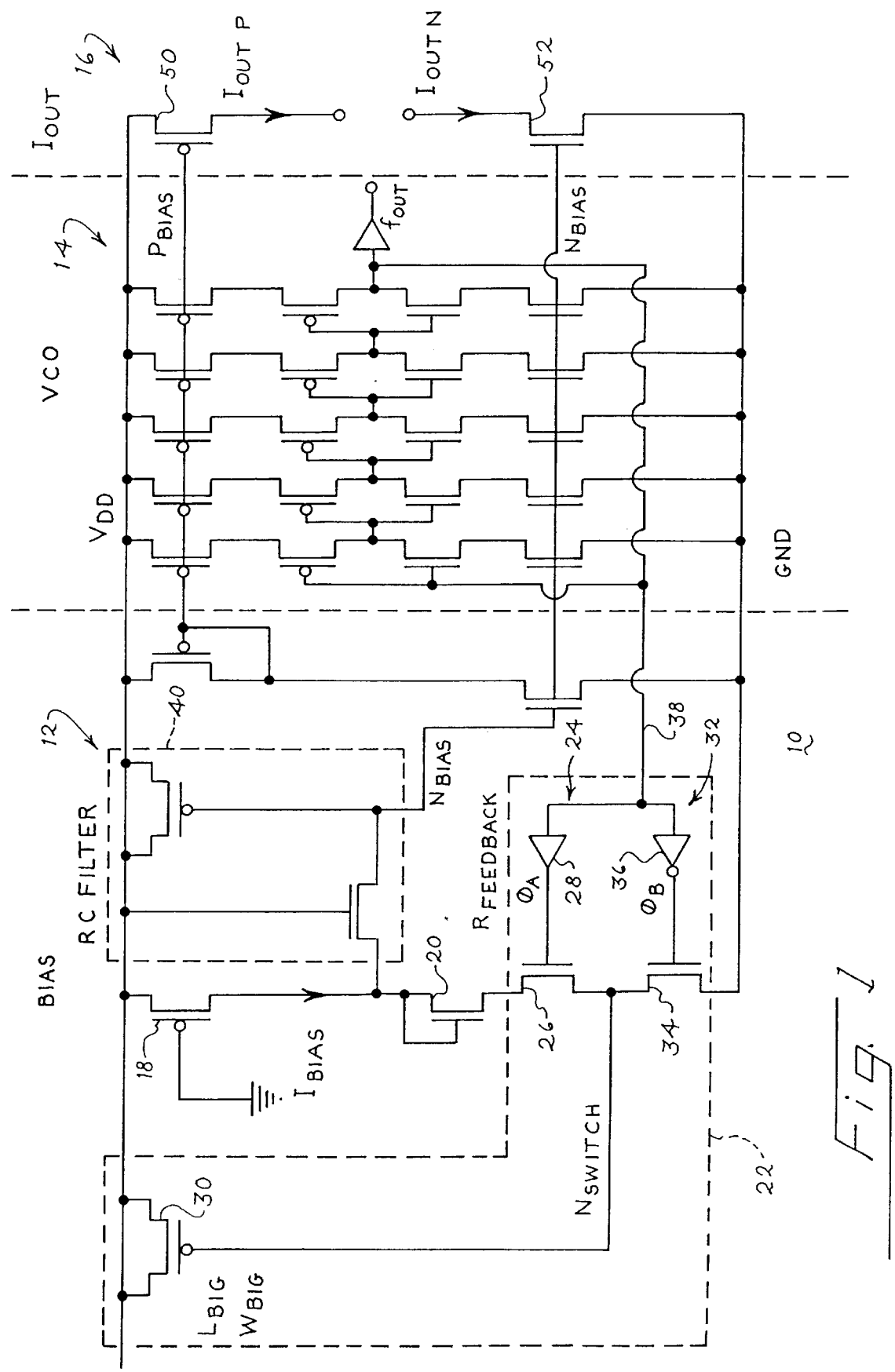
FIG. 1 is a schematic diagram of an integrated circuit that incorporates a preferred embodiment of this invention.

Turning now to the drawings, FIG. 1 shows an integrated circuit, all of components of which are formed on an integrated circuit substrate 10, e.g., a portion of a silicon die. The circuit of FIG. 1 includes a bias signal generating circuit 12, a voltage controlled oscillator 14, and an output circuit 16. The bias generating circuit 12 generates a bias signal that functions as a control signal setting the frequency of oscillation of the oscillator 14. The oscillator 14 generates an oscillating output signal that is applied to the bias generating circuit 12 in a negative feedback loop that reduces variations in the frequency of oscillation. Normal variations in process conditions can result in large variations in the free-running frequency of the oscillator 14. These variations are substantially reduced by operation of the bias generating circuit 12 as described below.

The bias generating circuit 12 sets the bias current $I_{bias}$ using only transistors, including the transistors 18, 20, 26 and 34. The transistors 26 and 34 are included in a switched capacitor circuit 22 that generates a feedback resistance $R_{feedback}$. This switched capacitor circuit 22 includes a capacitor 30 that in this example takes the form of the gate capacitor of an FET. The switched capacitor circuit 22 also includes a capacitor charging circuit 24 and a capacitor discharging circuit 32. The capacitor charging circuit 24 includes the transistor 26 and a buffer 28. The capacitor discharging circuit 32 includes the transistor 34 and an inverter 36. The buffer 28 and the inverter 36 are driven in parallel by an oscillating signal on the conductor 38. This oscillating signal is generated by the voltage controlled oscillator 14. The circuit 12 also includes an RC filter 40 formed of transistors.

The circuit 12 generates a bias voltage $N_{bias}$ close to the threshold voltage of an FET device. The switched capacitor circuit 22 provides a feedback resistance that is inversely proportional to the frequency of the oscillating signal on conductor 38. The resistance of the switched capacitor circuit 22 affects the bias voltage $N_{bias}$ such that an increase in frequency of the oscillating signal causes a reduction in the bias voltage $N_{bias}$. This bias voltage is used to control the frequency of the oscillator 14 that generates the oscillating signal, that is in turn applied to the switched capacitor circuit 22.

The current versus voltage curve of a typical FET is illustrated in FIG. 2. The preferred region of operation is illustrated in FIG. 2, and it is close to the sub-threshold to threshold region of an FET.

A linear change in frequency of the oscillator 14 results in a linear change in the resistor value of the circuit 22. However, since the bias voltage $N_{bias}$ is in or close to the sub-threshold region of an FET, a linear change in bias voltage results in an exponential change in bias current, and therefore an exponential change in oscillator frequency and high-gain feedback. As explained above, as the frequency of the oscillating signal that controls operation of the switched capacitor circuit 22 increases, the voltage of the bias signal $N_{bias}$ decreases, thereby providing the desired negative feedback. As a result, the operating frequency of the oscillator 14, and therefore the bias current $I_{bias}$, will not change much over voltage, temperature, and process variations. In this way, a stable current $I_{bias}$ and a stable frequency of the oscillator are achieved without any internal precision resistors or external components such as clock sources or precision resistors.

In addition to providing a stable output frequency for the oscillator 14, the circuit of FIG. 1 also provides stable current sources via the transistors 50 and 52 that generate stable output currents $I_{outp}$ and $I_{outn}$, respectively. The circuit of FIG. 1 provides the desired stable output frequency for the oscillator 14 without the need for a second oscillator controlled by the signals $N_{bias}$ and $P_{bias}$.

Many variations to the circuit of FIG. 1 are possible. FIG. 3 shows in schematic form a portion of the circuit of FIG. 1, in which the switched capacitor circuit 22 is connected in series with the diode-connected FET 20 and ground. In the alternative of FIG. 4, the switched capacitor circuit 22 is connected in series between the gate of the diode-connected FET 20 and ground. In the example of FIG. 5, the diode-connected FET is eliminated, and the switched capacitor circuit 22 is coupled in series with the FET 18.

Figure 6:
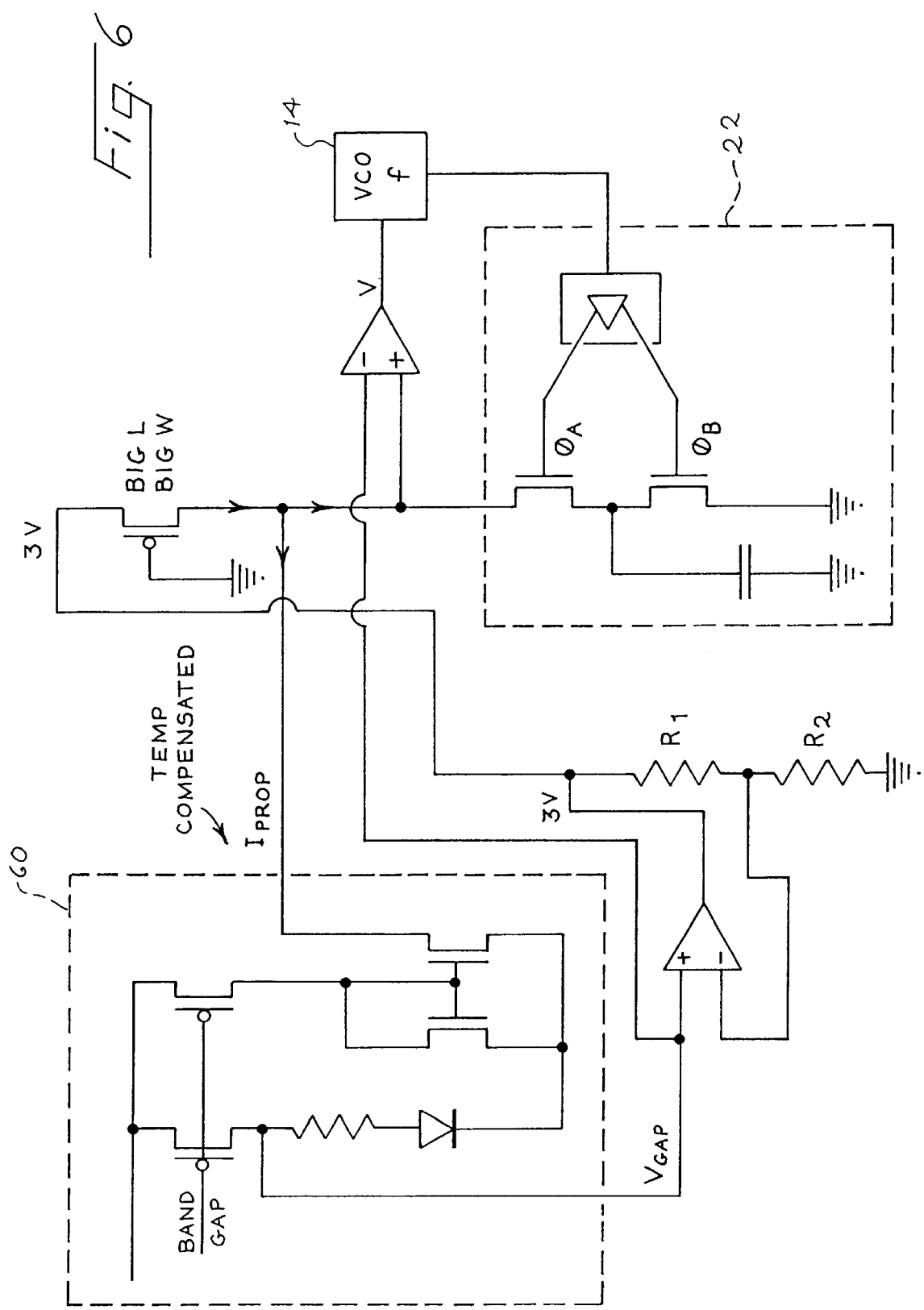
FIG. 6 is a schematic diagram of a second preferred embodiment.
Figure 7:
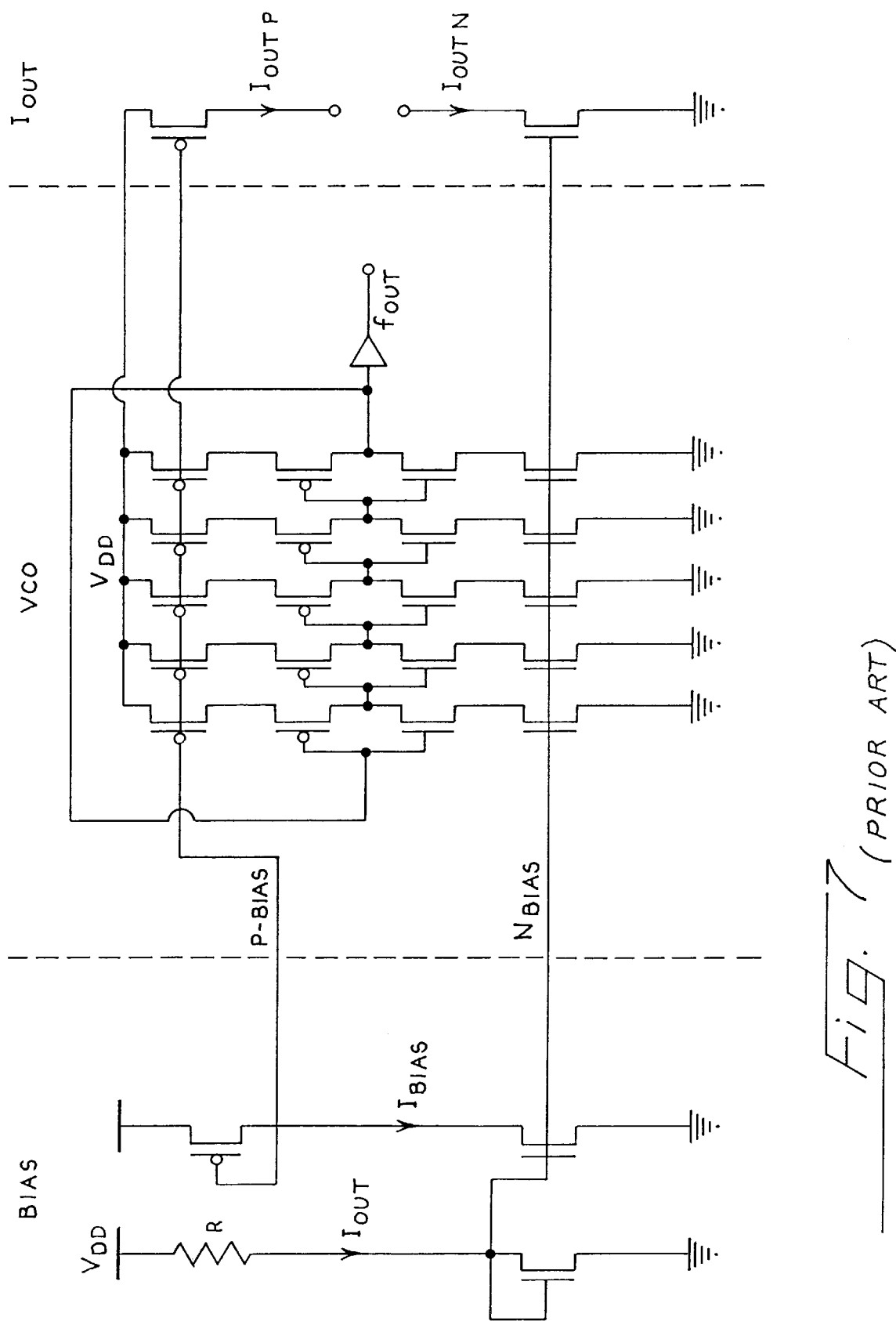
FIG. 7 is a schematic diagram of prior art.

The circuit of FIG. 6 provides yet another example of the manner in which the switched capacitor circuit 22 can be used to generate a stable bias voltage V. In this example, the feedback mechanism described above is combined with a more complex bias generating circuit including a band gap reference 60 to achieve better current control.

Of course, many other variations are possible. When a ring oscillator is used, the choice of the number of stages can be varied to be more or less than the illustrated five stage oscillator. The oscillator 14 uses an FET inverting circuit as a delay element, but any other suitable delay element can be used. Various types of capacitors can be used for the capacitor 30. In the example of FIG. 1, the node $N_{switch}$ is held close to ground. For this reason, using the gate capacitor of a PMOS transistor coupled to $V_{DD}$ as the capacitor 30 guarantees that the transistor is always on. However, noise coupling from $V_{DD}$ will now adversely affect $N_{bias}$, resulting in jitter and therefore variation in the output current. An alternative choice for the capacitor 30 is to use an accumulation capacitor ("MOS n-well") to ground for both the switched capacitor and the RC filter.

From the foregoing description in should be apparent that the oscillator 14 generates an oscillating signal that varies in accordance with the control signal $N_{bias}$. The capacitor 30 is alternatively charged and discharged at a rate that varies in accordance with the frequency of the oscillating signal generated by the oscillator 14, and the control signal $N_{bias}$ is generated at a value that varies in accordance with both the capacitance of the capacitor 30 and the frequency of the oscillating signal.

As used herein, the term "discharge" is used broadly to signify that a charge has been removed from a capacitor, whether or not the voltage on the capacitor is reduced to zero. Similarly, the term "charge" as used in this context is used to indicate charge has been added to a capacitor.

The term "in accordance with" is intended broadly to include various relationships. Thus, a first signal that varies in accordance with a second signal can vary directly, inversely, linearly, exponentially or otherwise with the second signal.

The foregoing detailed description has described only a few of the many forms that this invention can take. This detailed description is therefore intended by way of illustration and not limitation. It is only the following claims, including all equivalents, that are intended to define the scope of this invention.

What is claimed is:

1. A method for providing a stable current source, the method comprising:
    (a) providing an integrated circuit comprising:
        an integrated circuit substrate;
        an oscillator formed on the substrate and operative to generate an oscillating signal characterized by a frequency;
        a capacitor formed on the substrate, wherein the capacitor is directly coupled with a power supply $V_{DD}$;
        a capacitor charging circuit formed on the substrate and operative to charge the capacitor when the oscillating signal is in a first state;
        a capacitor discharging circuit formed on the substrate and operative to discharge the capacitor when the oscillating signal is in a second state; and
        a bias signal generator formed on the substrate, responsive to the capacitor, and operative to generate a bias signal at a level that varies in accordance with the frequency of the oscillating signal;
        wherein the oscillator is coupled with the bias signal such that the frequency of the oscillating signal varies in accordance with the bias signal; and
    (b) generating a stable current with the integrated circuit.

2. The invention of claim 1 wherein the bias signal generator is operative to generate the bias signal at a level that varies inversely with the frequency of the oscillating signal.

3. The invention of claim 1 wherein the capacitor comprises a gate capacitance of an FET carried by the substrate.

4. A method for generating an oscillating signal, said method comprising:
    (a) providing an oscillator and a capacitor formed on an integrated circuit substrate, wherein the capacitor is directly coupled with a power supply $V_{DD}$;
    (b) generating an oscillating signal with the oscillator at a frequency that varies in accordance with a control signal;
    (c) alternately charging and discharging the capacitor at a rate that varies in accordance with the oscillating signal; and
    (d) generating the control signal at a value that varies in accordance with both a capacitance of the capacitor and the rate of (c);
    wherein the oscillator and capacitor formed on the integrated circuit substrate generate a stable current.

5. The method of claim 4 wherein (a) comprises:
    (a1) providing the capacitor as a gate capacitor of an FET.

6. The invention of claim 1, wherein the integrated circuit operates close to a subthreshold region of an FET.

7. The invention of claim 1, wherein a linear change in the bias signal results in an exponential change in the oscillating signal.

8. The invention of claim 1, wherein a linear change in the bias signal results in an exponential change in the generated current.

9. The invention of claim 4, wherein a linear change in the control signal results in an exponential change in the oscillating signal.

10. The invention of claim 4, wherein a linear change in the bias signal results in an exponential change in a generated current.

* * * * *